(12) United States Patent
Hoshino

(10) Patent No.: US 6,812,699 B2
(45) Date of Patent: Nov. 2, 2004

(54) SYSTEMS AND METHODS FOR TUNING AN RF PULSE BY CHANGING A PULSE WIDTH OF THE RF PULSE

(75) Inventor: Kazuya Hoshino, Tokyo (JP)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 10/386,274

(22) Filed: Mar. 11, 2003

(65) Prior Publication Data

US 2003/0176781 A1 Sep. 18, 2003

(30) Foreign Application Priority Data

Mar. 12, 2002 (JP) ....................................... 2002-066854

(51) Int. Cl.⁷ ................................................. G01V 3/00
(52) U.S. Cl. ..................................................... 324/313
(58) Field of Search ............................... 324/300, 307, 324/309, 313, 314, 318, 322; 600/410, 419; 604/502; 327/114; 342/169; 356/444; 702/77

(56) References Cited

U.S. PATENT DOCUMENTS

| | | | |
|---|---|---|---|
| 4,065,714 A | * 12/1977 | Hill | ............................ 324/314 |
| 4,983,921 A | 1/1991 | Kramer et al. | |
| 5,031,624 A | 7/1991 | Mistretta et al. | |
| 5,166,617 A | * 11/1992 | Ni | ............................... 324/318 |
| 5,337,749 A | 8/1994 | Shimizu | |
| 5,424,646 A | 6/1995 | Hoshino | |
| 5,602,480 A | * 2/1997 | Onodera et al. | ............. 324/320 |
| 5,631,560 A | 5/1997 | Machida | |
| 5,754,047 A | * 5/1998 | Onodera et al. | ............. 324/320 |
| 5,833,610 A | 11/1998 | Yokawa et al. | |
| 5,846,197 A | 12/1998 | Edelman | |
| 5,952,827 A | * 9/1999 | Feinberg | ...................... 324/309 |
| 6,046,592 A | * 4/2000 | Rathke et al. | ............... 324/321 |
| 6,054,853 A | 4/2000 | Miyamoto et al. | |
| 6,191,583 B1 | * 2/2001 | Gerald et al. | ................ 324/318 |
| 6,346,229 B1 | 2/2002 | Driehuys et al. | |
| 6,456,072 B1 | * 9/2002 | Webb et al. | ................. 324/308 |
| 6,491,895 B2 | 12/2002 | Driehuys et al. | |

FOREIGN PATENT DOCUMENTS

| | | | |
|---|---|---|---|
| JP | 61-118648 | * | 5/1986 |
| JP | 1-218435 | * | 8/1989 |

* cited by examiner

*Primary Examiner*—Brij Shrivastav
*Assistant Examiner*—Dixomara Vargas
(74) *Attorney, Agent, or Firm*—Carl B. Horton, Esq.; Armstrong Teasdale LLP

(57) ABSTRACT

For the purpose of RF pulse tuning so as to effectively utilize the capacity of an RF transmission apparatus, in tuning the RF pulse for excitation use so as to make the flip angle of spins identical with its target value, the pulse width of the RF pulse is consecutively increased from its predetermined initial value until the flip angle of spins become identical with its target value (902 through 912). Further, if the flip angle fails to reach its target value even though the amplitude of the RF pulse is raised to the adjustable maximum, the next increment of the pulse width is determined according to the extent of failure to attain the target.

13 Claims, 11 Drawing Sheets

SYSTEMS AND METHODS FOR TUNING AN RF PULSE BY CHANGING A PULSE WIDTH OF THE RF PULSE

CROSS REFERENCE TO RELATED APPLICATIONS

This application claims the benefit of Japanese Application No. 2002-066854 filed Mar. 12, 2002.

BACKGROUND OF THE INVENTION

The present invention relates to a radio frequency (RF) pulse tuning method and apparatus, and more particularly to a method and an apparatus for so controlling an RF pulse for excitation use to make the flip angle of spins identical with its target value.

In a magnetic resonance imaging (MRI) apparatus, the subject of imaging is brought into the internal space of its magnet system, i.e. an imaging space in which a magnetostatic field is formed, a gradient magnetic field and a high frequency magnetic field are applied to the subject, magnetic resonance signals are generated from spins excited therein, and an image is reconstructed on the basis of the signals so received.

A high frequency magnetic field is applied in the form of transmission of an RF pulse. To ensure appropriate excitation of spins, the RF pulse is controlled in advance of imaging. The control of the RF pulse is also known as RF pulse tuning.

In RF pulse tuning, transmission of the RF pulse is performed on a trial basis while consecutively varying the transmission gain of the RF transmission apparatus, i.e. the amplitude of the RF pulse. The reach of the flip angle of spins is checked on the basis of the magnetic resonance signal each time to figure out the optimal transmission gain.

The optimal transmission gain means a transmission gain that can make the flip angle of spins identical with its target value. As the optimal transmission gain differs from one subject of imaging to another, RF pulse tuning is performed for each subject. In the following description, RF pulse tuning may be sometimes referred to as simply tuning.

In order to ensure proper tuning for a subject having a large physique, the RF pulse width can be changed over to a large value. The pulse width is changed over according to the body weight of the subject. The weight datum is inputted in advance by the user of the MRI apparatus.

The upper limit of the pulse width is set to a considerably high level in order to ensure that tuning to a subject having a large physique can be accomplished without fail. In other words, the RF transmission apparatus is so configured as to permit such an output.

Such an RF transmission apparatus has a considerable surplus in capacity relative to the truly required output in actual imaging. For this reason, where a large pulse width is used, the RF pulse is often transmitted at a considerably lower gain than the maximum gain. This means that the capacity of the RF transmission apparatus is not effectively utilized.

SUMMARY OF THE INVENTION

An object of the present invention, therefore, is to realize a method and an apparatus for so performing RF pulse tuning as to enable the capacity of the RF transmission apparatus to be effectively utilized.

(1) An invention to solve the problem noted above from one point of view is a method for tuning an RF pulse for excitation use so as to make the flip angle of spins identical with a target value, characterized in that the pulse width of the RF pulse is consecutively increased from its predetermined initial value until the flip angle of spins become identical with the target value.

(2) An invention to solve the problem noted above from another point of view is an apparatus for tuning an RF pulse for excitation use so as to make the flip angle of spins identical with a target value, characterized in that it is provided with a pulse width adjusting means for consecutively increasing the pulse width of the RF pulse from its predetermined initial value until the flip angle of spins become identical with the target value.

The invention from the viewpoints stated in (1) and (2), since the pulse width of the RF pulse is consecutively increased from its predetermined initial value until the flip angle of spins become identical with the target value, the RF pulse is tuned so as to minimize the pulse width and to maximize the pulse amplitude. By using such an RF pulse for spin excitation, it is made possible to effectively utilize the capacity of the RF transmission apparatus.

(3) An invention to solve the problem noted above from another point of view is a method for tuning an RF pulse for excitation use so as to make the flip angle of spins identical with a target value, characterized in that the pulse width of the RF pulse is consecutively increased from its predetermined initial value until the flip angle of spins becomes identical with an intermediate target value, and the conditions of the RF pulse for making the flip angle of spins identical with a final target value which is smaller than the intermediate target value are calculated from the conditions of the RF pulse for making the flip angle of spins identical with the intermediate target value.

(4) An invention to solve the problem noted above from another point of view is an RF pulse tuning apparatus for tuning an RF pulse for excitation use so as to make the flip angle of spins identical with a target value, characterized in that it is provided with a pulse width adjusting means for consecutively increasing the pulse width of the RF pulse from its predetermined initial value until the flip angle of spins become identical with an intermediate target value, and a calculating means for calculating the conditions of the RF pulse for making the flip angle of spins identical with a final target value which is smaller than the intermediate target value from the conditions of the RF pulse for making the flip angle of spins identical with the intermediate target value.

The invention from the viewpoints stated in (3) and (4), since the pulse width of the RF pulse is consecutively increased from its predetermined initial value until the flip angle of spins become identical with an intermediate target value, the RF pulse is intermediately tuned so as to minimize the pulse width and to maximize the pulse amplitude.

Since the conditions of the RF pulse for making the flip angle of spins identical with a final target value which is smaller than the intermediate target value from the conditions of the RF pulse for making the flip angle of spins identical with the intermediate target value, there is obtained a final tuning pulse which would minimize the pulse width and maximize the pulse amplitude. By using such an RF pulse for spin excitation, it is made possible to effectively utilize the capacity of the RF transmission apparatus.

It is preferable for the aforementioned calculation to figure out the pulse width at the maximum adjustable amplitude of the RF pulse with a view to minimizing the width of the RF pulse.

If the flip angle fails to reach the target value even though the amplitude of the RF pulse is raised to the adjustable maximum, it is preferable with a view to reducing the length of time required for tuning to determine the next increment of the pulse width according to the extent of failure to attain the target.

It is preferable for the aforementioned target value to be 90° with a view to 90° pulse tuning.

It is preferable for the aforementioned target value to be 180° with a view to 180° pulse tuning.

According to the present invention, it is possible to realize a method and an apparatus for carrying out RF pulse tuning so as to effectively utilize the capacity of the RF transmission apparatus.

Further objects and advantages of the present invention will be apparent from the following description of the preferred embodiments of the invention as illustrated in the accompanying drawings.

DETAILED DESCRIPTION OF THE INVENTION

Figure 1:
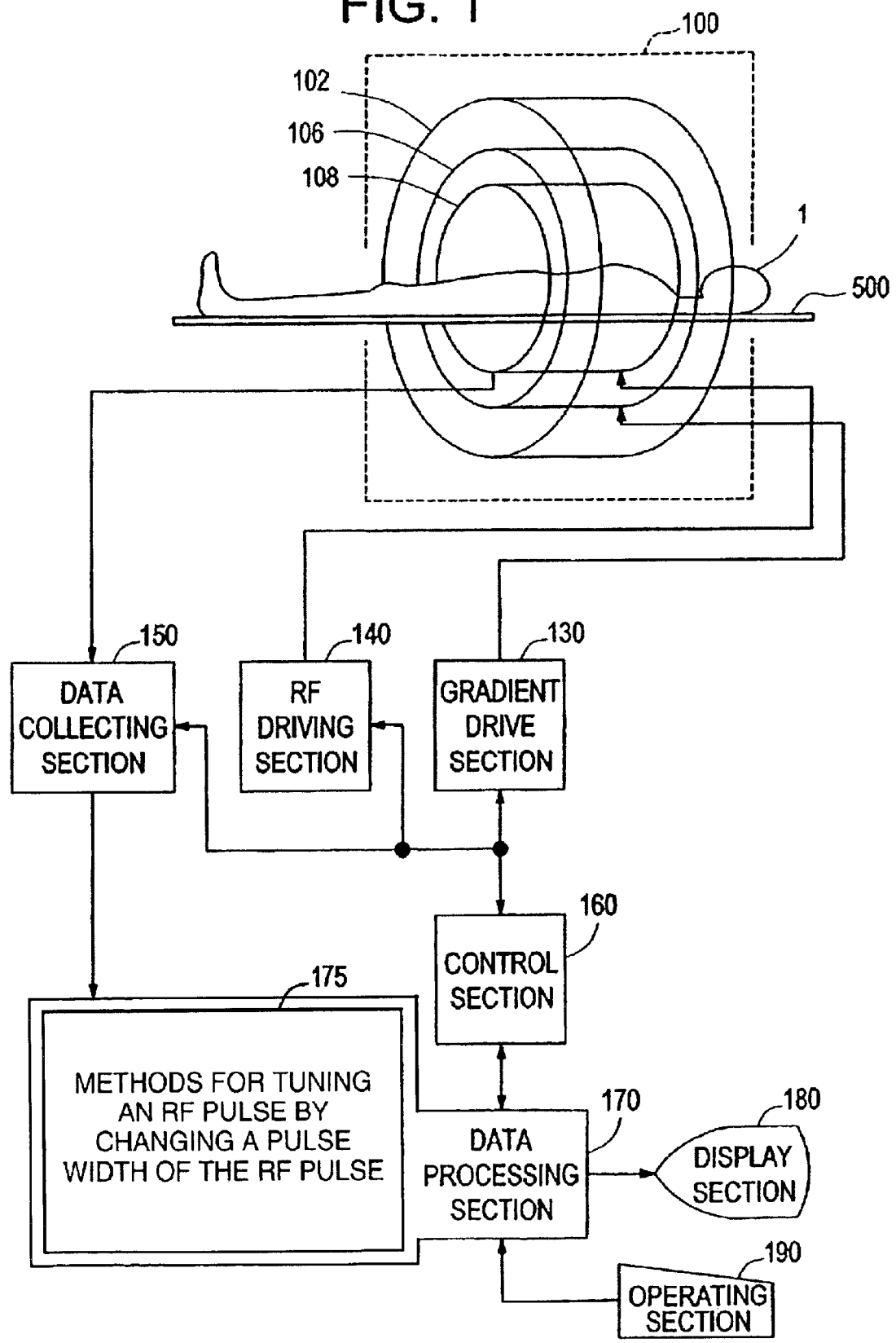
FIG. 1 is a block diagram of an apparatus, which represents an example of mode of implementing the present invention.

Modes of carrying out the present invention will be described in detail below with reference to drawings. FIG. 1 is a block diagram of a magnetic resonance, imaging, (MRI), apparatus. RF pulse tuning is performed with this apparatus. This apparatus represents an example of mode of implementing the invention. The configuration of the apparatus embodies the example of mode of implementing the invention. The operation of the apparatus represents the example of mode of implementation pertaining to a method according to the invention.

As shown in the diagram, the apparatus has a magnet system 100. The magnet system 100 is installed in a scan room. The magnet system 100 has a main magnetic field coil section 102, a gradient coil section 106 and an RF coil section 108. These coil sections have substantially cylindrical shapes and are coaxially arranged. The subject of imaging 1, mounted on a cradle 500 is brought into and out of the substantially cylindrical internal space (bore) of the magnet system 100 by a carrying means not shown.

The main magnetic field coil section 102 generates a magnetostatic field in the internal space of the magnet system 100. The direction of the magnetostatic field is substantially in parallel to that of the bodily axis of the subject 1. Thus there is formed a so-called horizontal magnetic field. The main magnetic field coil section 102 is configured of, for instance, a superconducting coil. Of course, it is not limited to a superconducting coil, but can as well be configured of a normal conducting coil.

The gradient coil section 106 generates three gradient magnetic fields for giving a gradient to the magnetostatic field intensity in each of the directions of the three mutually orthogonal axes, i.e. a slicing axis, a phase axis and a frequency axis.

Any of mutually orthogonal axes in a magnetostatic field, represented by x, y and z, can be the slicing axis. Then, one of the remaining two axes is supposed to be the phase axis, and the other, the frequency axis. The slicing axis, the phase axis and the frequency axis can be inclined in any desired angle relative to the x, y and z axes while maintaining their mutual orthogonality. In this apparatus, the direction of the bodily axis of the subject 1 is supposed to be the direction of the z axis.

The gradient magnetic field in the direction of the slicing axis may also be referred to as the slicing gradient magnetic field. The gradient magnetic field in the direction of the phase axis may also be referred to as the phase encode gradient magnetic field. The gradient magnetic field in the direction of the frequency axis may also be referred to as the read-out gradient magnetic field. To generate such gradient magnetic fields, the gradient coil section 106 has three lines of gradient coils not shown. The gradient magnetic field may herein after be referred to as simply the gradient.

The RF coil section 108 generates in the magnetostatic field space a high frequency magnetic field for exciting spins in the body of the subject 1. The generation of the high frequency magnetic field may hereinafter be also referred to as the transmission of an RF exciting signal. The RF exciting signal may also be referred to as the RF pulse. The RF coil section 108 also receives an electromagnetic wave on which excited spins occur, i.e. the magnetic resonance signal.

The RF coil section 108 has a transmission coil and the reception coil, neither shown. The same coil may be used commonly as the transmission coil and the reception coil or a dedicated coil may be provided for each of the two different purposes.

To the gradient coil section 106 is connected a gradient drive section 130. The gradient drive section 130 provides a drive signal to the gradient coil section 106 to cause it to generate a gradient magnetic field. The gradient drive section 130 has three lines of drive circuits, not shown, matching the three lines of gradient coil in the gradient coil section 106.

To the RF coil section 108 is connected an RF drive section 140. The RF drive section 140 provides a drive signal to the RF coil section 108 to cause it to transmit the RF pulse and thereby to excite spins in the body of the subject 1.

To the RF coil section 108 is connected a data collecting section 150. The data collecting section 150 takes in signals received by the RF coil section 108 by sampling, and collects them as digital data.

To the gradient drive section 130, the RF drive section 140 and the data collecting section 150 is connected a control section 160. The control section 160 controls the gradient drive section 130 or the data collecting section 150 to have magnetic resonance signals collected.

The control section 160 is configured of, for instance, a computer or the like. The control section 160 has a memory not shown. The memory stores programs and various data for the control section 160. The functions of the control section 160 are realized by the execution by the computer of the respectively pertinent programs stored in the memory.

The output side of the data collecting section 150 is connected to a data processing section 170. Data collected by the data collecting section 150 are inputted to the data processing section 170. The data processing section 170 is configured of, for instance, a computer or the like. The data processing section 170 has a memory not shown. The memory stores programs including methods 175, described below with reference to FIGS. 7 and 9–14, for tuning an RF pulse by changing a pulse width of the RF pulse. The memory also stores various data used by the data processing section 170.

The data processing section 170 is connected to the control section 160. The data processing section 170 is superior in position to and supervises the control section 160. The functions of the apparatus are realized by the execution by the data processing section 170 of the respectively pertinent programs stored in the memory.

The data processing section 170 stores in the memory the data collected by the data collecting section 150. In the memory is formed a data space. This data space constitutes a two-dimensional Fourier space. Hereinafter the two-dimensional Fourier space may also be referred to as the k-space. The data processing section 170 reconstructs an image of the subject 1 by subjecting data in the k-space to two-dimensional inverse Fourier transform.

To the data processing section 170 are connected a display section 180 and an the operating section 190. The display section 180 is configured of a graphic display or the like. The operating section 190 is configured of a keyboard or the like provided with a pointing device.

The display section 180 displays reconstructed images and various items of information outputted from the data processing section 170. The operating section 190 is manipulated by the user to input various instructions, information and the like to the data processing section 170. The user interactively manipulates the apparatus through the display section 180 and the operating section 190.

Figure 2:
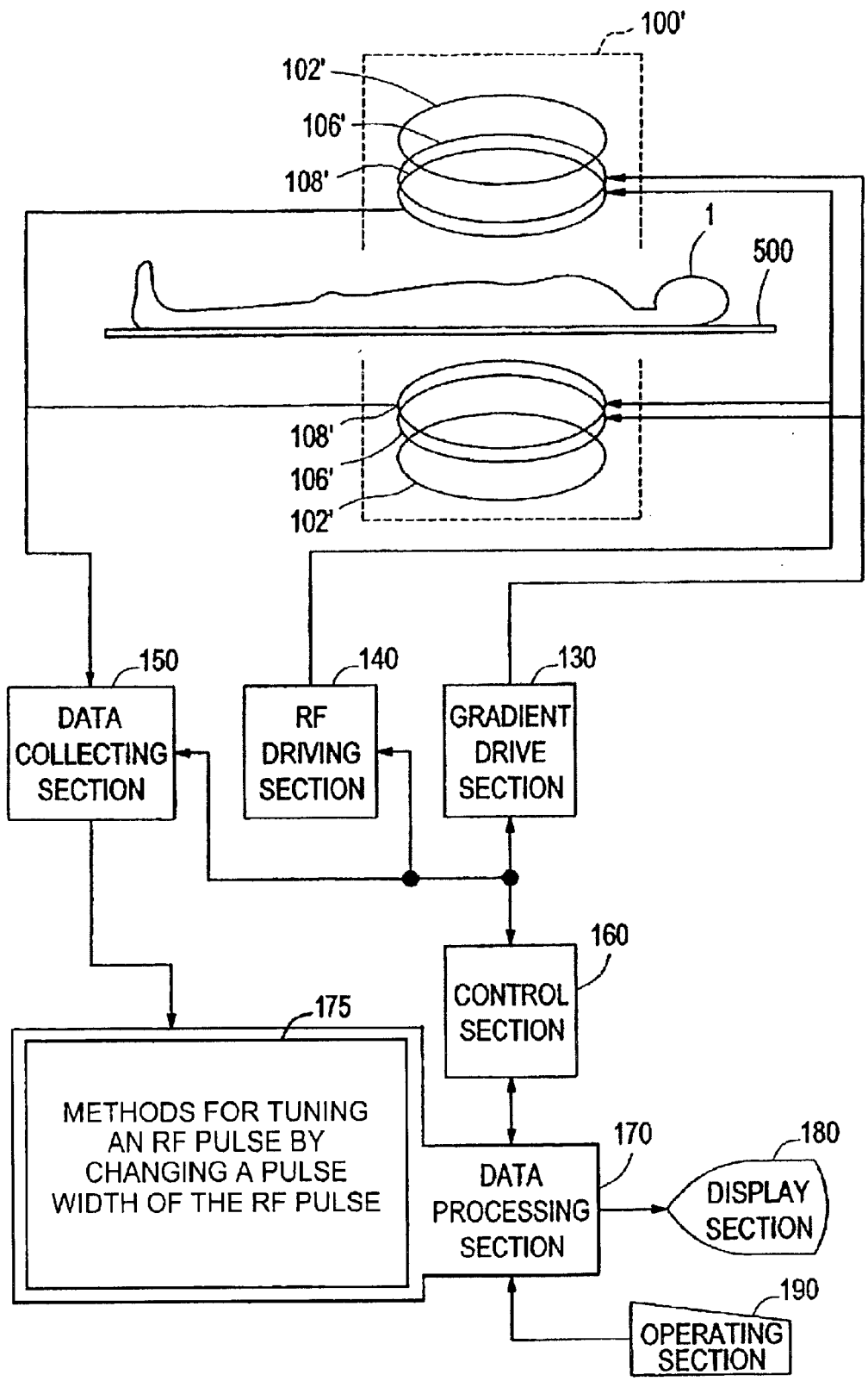
FIG. 2 is a block diagram of an apparatus, which represents an example of mode of implementing the invention.

FIG. 2 is a block diagram of a magnetic resonance imaging apparatus of another formula. RF pulse tuning is performed by this apparatus, too. The magnetic resonance imaging apparatus illustrated in this diagram represents another example of implementing the present invention. The configuration of the apparatus embodies the example of mode of implementing the invention. The operation of the apparatus represents the example of mode of implementation pertaining to a method according to the invention.

This apparatus has a magnet system 100' differing in formula from the apparatus shown in FIG. 1. The magnet system 100' is installed within the scan room. This apparatus has a similar configuration to the apparatus shown in FIG. 1 except the magnet system 100', and the same reference signs will be assigned to respectively the same constituent parts, with their description being dispensed with.

The magnet system 100' has a main magnetic field magnet section 102', a gradient coil section 106' and an RF coil section 108'. Each of these main magnetic field magnet section 102' and coil sections is paired, the units constituting each pair disposed opposite each other with a space between them. Each of the units has a substantially disk shape, all arranged to share the same center axis. The subject of imaging 1, mounted on the cradle 500, is brought into and out of the internal space (bore) of the magnet system 100' by a carrying means not shown.

The main magnetic field magnet section 102' forms a magnetostatic field in the internal space of the magnet system 100'. The direction of the magnetostatic field is substantially orthogonal to that of the bodily axis of the subject 1. Thus there is formed a so-called vertical magnetic field. The main magnetic field coil section 102' is configured of, for instance, a permanent magnet. Of course, it is not limited to a permanent magnet but can as well be configured of a superconducting electromagnet, a normal conducting electromagnet or the like.

The gradient coil section 106' generates three gradient magnetic fields for giving a gradient to the magnetostatic field intensity in each of the directions of the three mutually orthogonal axes, i.e. a slicing axis, a phase axis and a frequency axis.

Any of mutually orthogonal axes in a magnetostatic field, represented by x, y and z, can be the slicing axis. Then, one of the remaining two axes is supposed to be the phase axis, and other, the frequency axis. The slicing axis, the phase axis and the frequency axis can be inclined in any desired angle to the x, y and z axes while maintaining their mutual orthogonality. In this apparatus, too, the direction of the bodily axis of the subject 1 is supposed to be the direction of the z axis.

The gradient magnetic field in the direction of the slicing axis may also be referred to as the slicing gradient magnetic field. The gradient magnetic field in the direction of the phase axis may also be referred to as the phase encode gradient magnetic field. The gradient magnetic field in the direction of the frequency axis may also be referred to as the read-out gradient magnetic field. To generate such gradient magnetic fields, the gradient coil section 106' has three lines of gradient coils not shown.

The RF coil section 108' generates in the magnetostatic field space a high frequency magnetic field for exciting spins in the body of the subject 1. The RF coil section 108' also receives an electromagnetic wave on which excited spins occur, i.e. the magnetic resonance signal.

The RF coil section 108' has a transmission coil and the reception coil, neither shown. The same coil may be used commonly as the transmission coil and the reception coil or a dedicated coil may be provided for each of the two different purposes.

Figure 3:
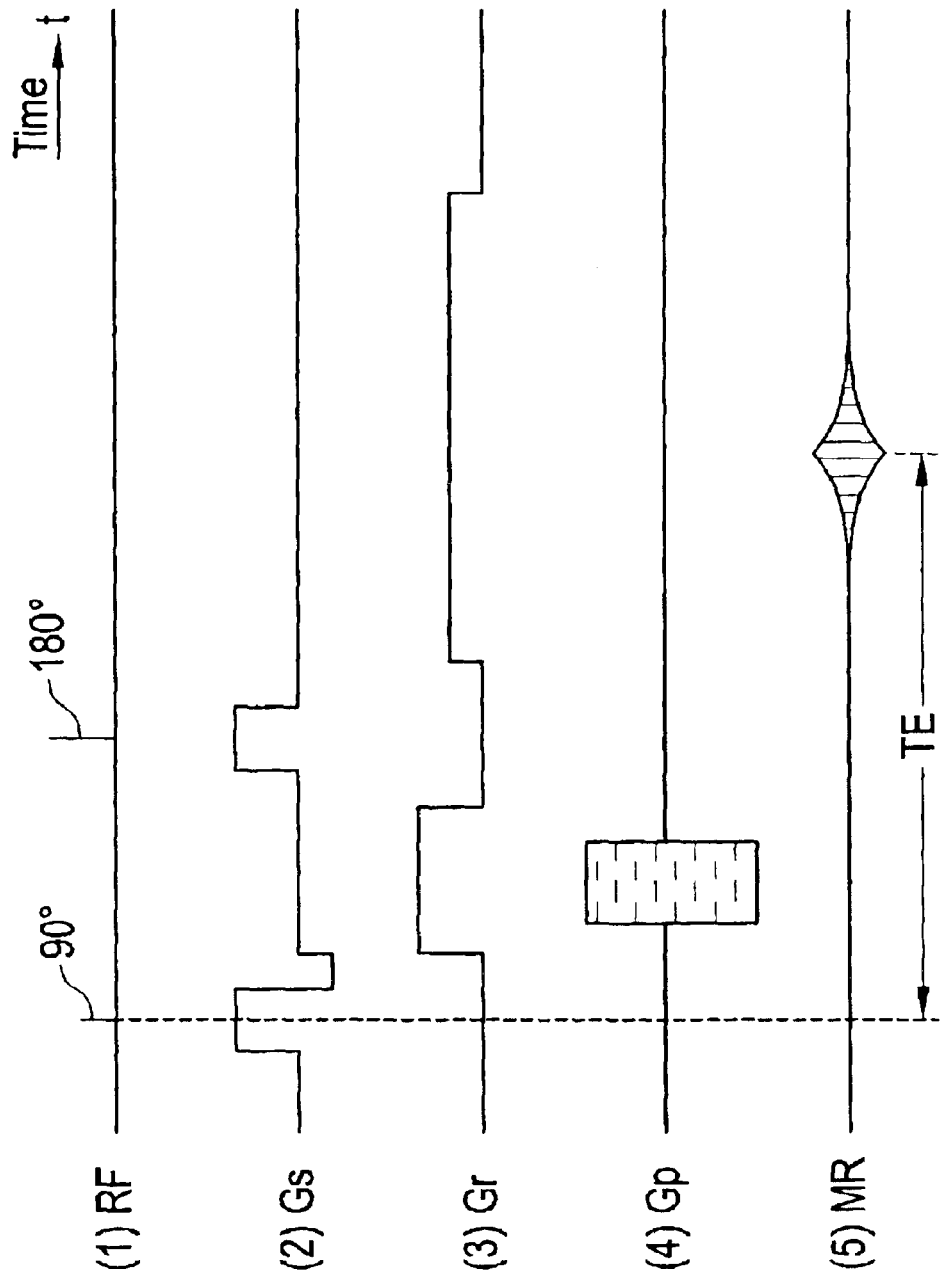
FIG. 3 is a diagram illustrating an example of pulse sequence executed by an apparatus, which represents an example of mode of implementing the invention.

FIG. 3 illustrates an example of pulse sequence used in magnetic resonance imaging. This pulse sequence is a pulse sequence by the spin echo (SE) method.

Thus, (1) is a 90° pulse and 180° pulse sequence for RF excitation by the SE method, and (2), (3), (4) and (5) are respectively slicing gradient Gs, read-out gradient Gr, phase encode gradient GP and spin echo MR sequences. The 90° pulse and the 180° pulse are represented by the respective center signals. A pulse sequence proceeds from left to right along a time axis t.

As shown in the diagram, 90° spin excitation is performed with the 90° pulse. Then the slicing gradient Gs is applied, and selective excitation is performed with respect to a prescribed slice. After the lapse of a prescribed length of time from the 90° excitation, 180° excitation, i.e. spin reversal, with the 180° pulse takes place. This time again, the slicing gradient Gs is applied, selective reversal takes place with respect to the same slice.

During the period between the 90° excitation and the spin reversal, the read-out gradient Gr and the phase encode gradient Gp are applied. The spin is dephased with the read-out gradient Gr. Phase encoding of the spin is performed with the phase encode gradient Gp.

After the spin reversal, the spin is rephased with the read-out gradient Gr to generate a spin echo MR. The spin echo MR is an example of mode of implementing a magnetic resonance signal according to the invention. The spin echo MR constitutes an RF signal having a waveform symmetric with respect to the echo center. The center echo generates a TE (echo time) after the 90° excitation. The spin echo MR is collected by the data collecting section 150 as view data.

Such a pulse sequence is repeated 64 to 512 times in a cycle of TR(repetition time). Every time it is repeated, the phase encode gradient GP is altered to perform phase encoding in a different way each time. This provides view data on 64 to 512 views differing in phase-encoded quantity.

Figure 4:
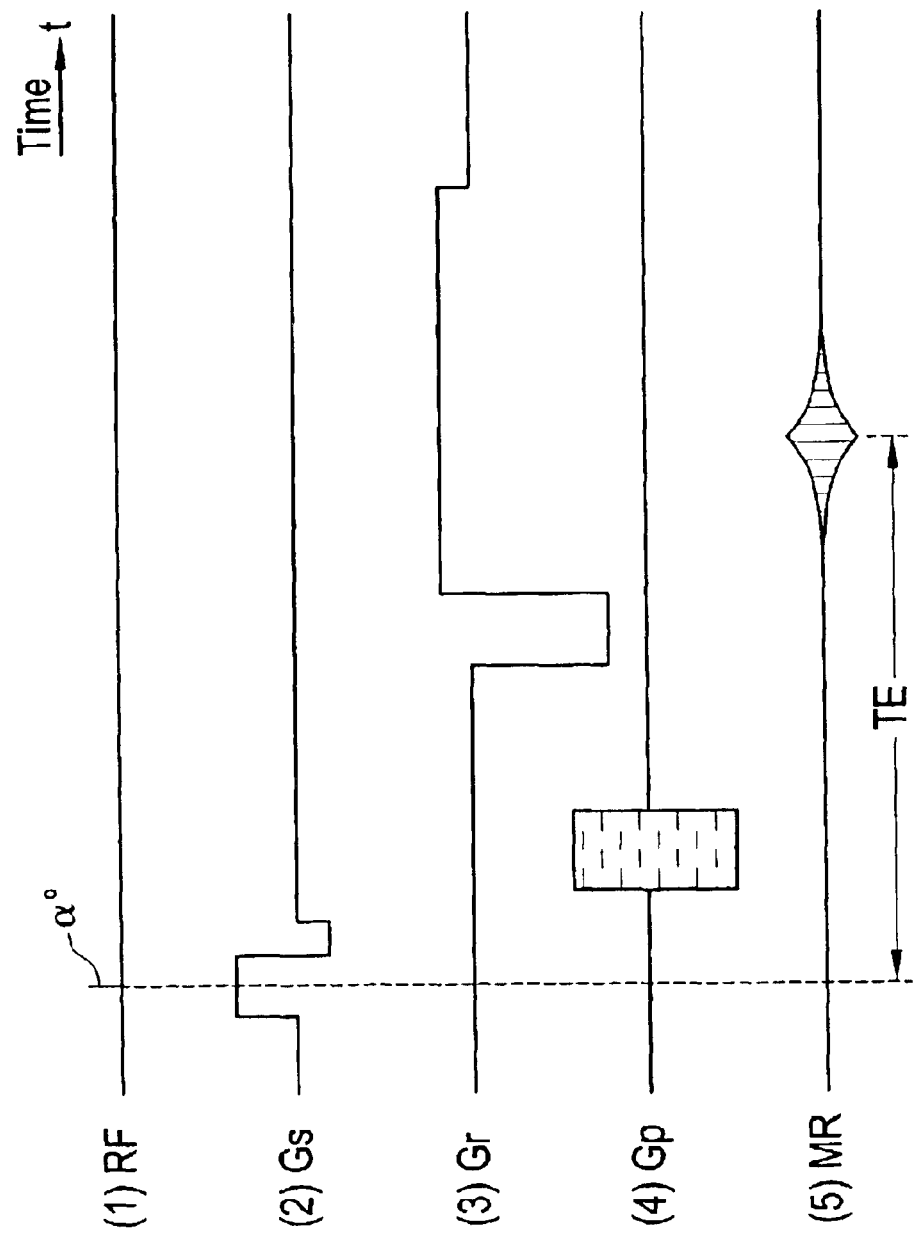
FIG. 4 is a diagram illustrating an example of pulse sequence executed by an apparatus, which represents an example of mode of implementing the invention.

Another example of pulse sequence for magnetic resonance imaging is shown in FIG. 4. This pulse sequence is a pulse sequence by the gradient echo (GRE) method.

Thus, (1) is an α° pulse sequence for RF excitation by the GRE method, and (2), (3), (4) and (5) are respectively slicing gradient Gs, read-out gradient Gr, phase encode gradient Gp and spin echo MR sequences. The α° pulse is represented by the respective center signals. A pulse sequence proceeds from left to right along a time axis t.

As shown in the diagram, α° spin excitation is performed with the α° pulse, where α is not more than 90. Then, the slicing gradient Gs is applied, and selective excitation is performed with respect to a prescribed slice.

After the α° excitation, the spin is phase-encoded with the phase encode gradient GP. Then, the spin is first dephased with the read-out gradient Gr and then rephased to generate a gradient echo MR. The gradient echo MR is an example of mode of implementing a magnetic resonance signal according to the invention. The gradient echo MR constitutes an RF signal having a waveform symmetric with respect to the echo center. The center echo generates a TE (echo time) after the α° excitation. The gradient echo MR is collected by the data collecting section 150 as view data.

Such a pulse sequence is repeated 64 to 512 times in a cycle of TR. Every time it is repeated, the phase encode gradient GP is altered to perform phase encoding in a different way each time. This provides view data on 64 to 512 views differing in phase-encoded quantity.

View data obtained by the pulse sequences illustrated in FIG. 3 or FIG. 4 are collected into the memory of the data processing section 170. To add, the pulse sequence is not limited to the SE method or the GRE method, but it goes without saying that any other appropriate technique can be used, such as the fast spin echo (FSE) method or the echo planar imaging (EPI) method for instance.

Figure 5:
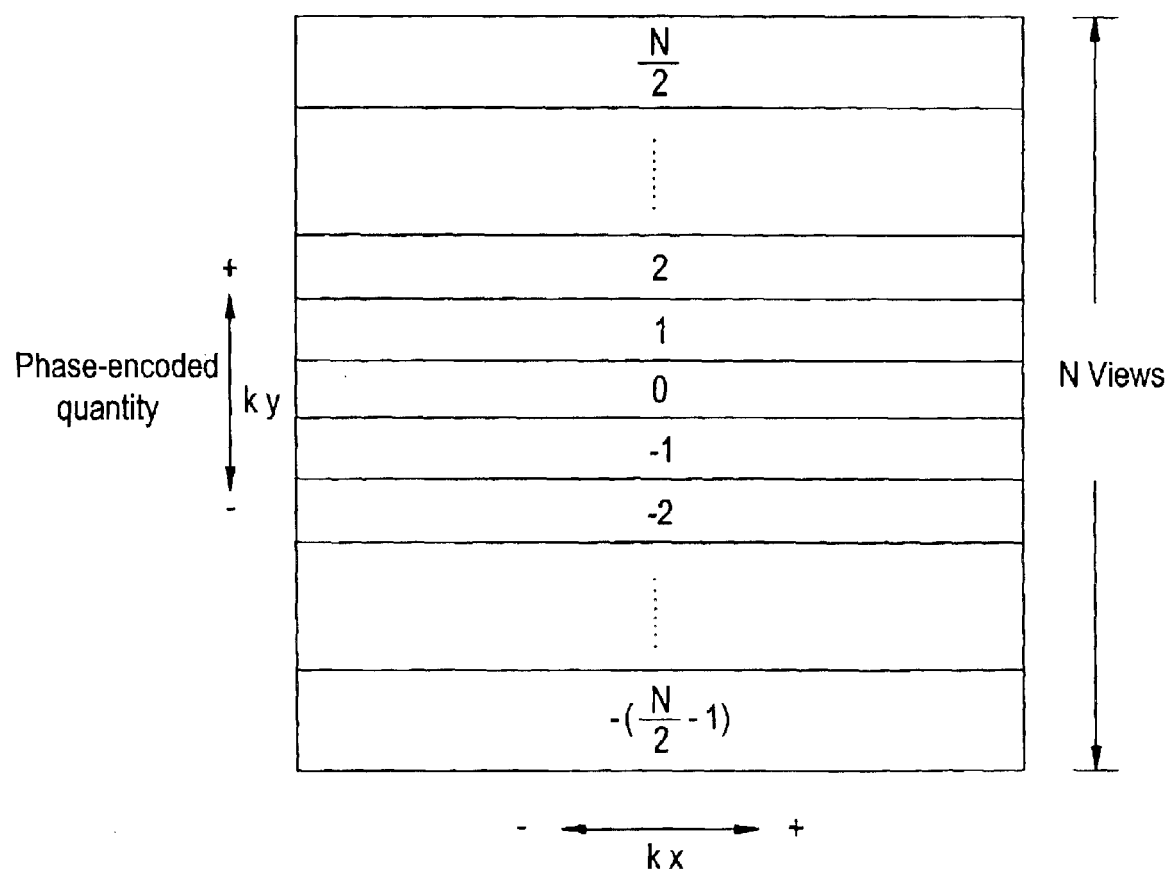
FIG. 5 is a conceptual diagram of the k-space.

FIG. 5 is a conceptual diagram of, the k-space. In the k-space, the horizontal axis kx is the frequency axis and the vertical axis ky is the phase axis. In the diagram, each of the plurality of horizontally longer rectangles represents a set of view data. Hereinafter, view data may also be referred to as MR data. The numeral marked in each rectangle represents the phase-encoded quantity. The phase-encoded quantity is normalized by $\pi/N$. N ranges from 64 to 512. The phase-encoded quantity is 0 at the center of the phase axis ky. The phase-encoded quantity gradually increases from the center towards both ends. The polarities of the increase are reverse to each other. The data processing section, 170 reconstructs the tomographic image of the subject 1 by subjecting such view data to two-dimensional inverse Fourier transform. Reconstructed images are stored into the memory.

Figure 6:
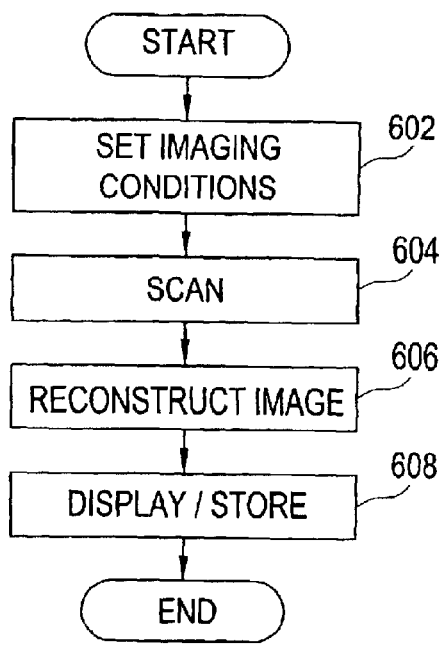
FIG. 6 is a flow chart of the operation of an apparatus, which represents an example of mode of implementing the invention.

FIG. 6 is a flow chart of the imaging operation of the apparatus. As shown in the chart, the conditions of imaging are set at step 602. The setting of the conditions of imaging is accomplished by the user through the operating section 190. Desired conditions of imaging, including the scan parameter, are thereby set. As part of the setting of the conditions of imaging, RF pulse tuning is performed. RF pulse tuning will be described afterwards.

Scanning is done at step 604. The scanning is accomplished by the execution of the pulse sequences described above under the control of the control section 160, and MR data are consecutively acquired oh each view.

After the acquisition of MR data on all the views, image reconstruction is accomplished by the data processing section 170 at step 606. The reconstructed image is displayed on the display section 180 at step 608 and stored into the memory.

Figure 7:
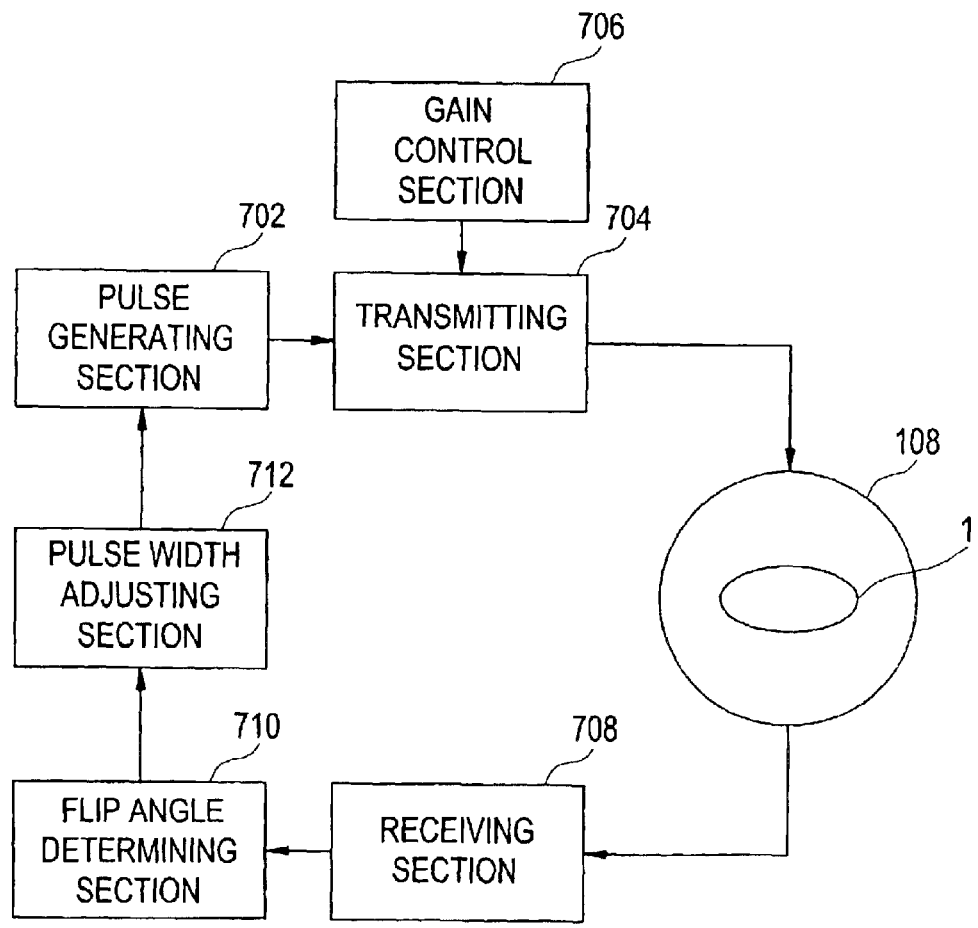
FIG. 7 is a functional block diagram of an apparatus, which represents an example of mode of implementing the invention.

FIG. 7 is a functional block diagram of the apparatus with focus on RF pulse tuning. This functional block diagram shows the configuration of the RF pulse tuning apparatus. As illustrated here, this apparatus has a pulse generating section 702 and a transmitting section 704. An RF pulse generated by the pulse generating section 702 is supplied to the RF coil section 108 through the transmitting section 704 to excite spins in the subject 1.

Figure 8:
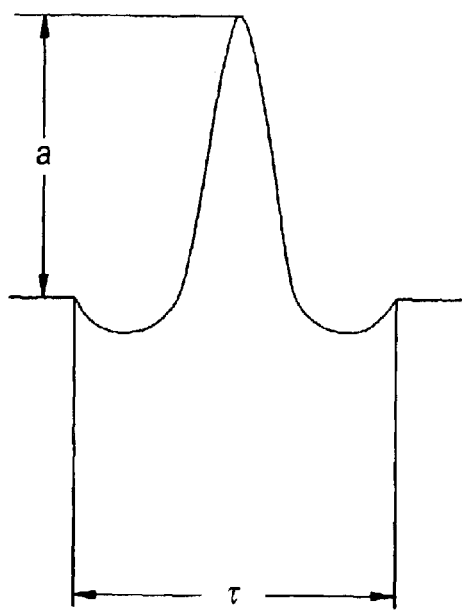
FIG. 8 is a waveform diagram of an RF pulse.

The RF pulse supplied to the RF coil section 108 has a waveform as shown in FIG. 8, for instance. The amplitude of the RF pulse is a and the pulse width, τ. The gain of the output of the transmitting section 704 is variable. The amplitude a of the RF pulse varies with the gain. The gain is controlled by a gain control section 706. Therefore, the amplitude a of the RF pulse is controlled by the gain control section 706.

The functions of the part including the pulse generating section 702, the transmitting section 704 and the gain control section 706 correspond to the functions of the part including the RF drive section 140 and the control section 160 in the apparatus shown in FIG. 1 or FIG. 2.

The spins excited in the subject 1 give rise to magnetic resonance signals. The magnetic resonance signals include, for instance, FID (free induction decay). The magnetic resonance signals are received by a receiving section 708 through the RF coil section 108. The functions of the receiving section 708 correspond to those of the data collecting section 150.

The received magnetic resonance signals are inputted to a flip angle determining section 710. The flip angle determining section 710 determines, on the basis of the received signals, determines whether or not the flip angle of the spin is identical with its target value. Flip angle determination by the flip angle determining section 710 will be described afterwards.

A determination signal from the flip angle determining section 710 is inputted to a pulse width adjusting section 712. The pulse width adjusting section 712 generates a pulse width adjusting signal on the basis of the determination signal. The pulse width adjusting signal is inputted to the pulse generating section 702, and serves to adjust the width of the RF pulse generated by the pulse generating section 702.

The functions of the part including the flip angle determining section 710 and the pulse width adjusting section 712 correspond to the functions of the data processing section 170. The part including the flip angle determining section 710 and the pulse width adjusting section 712 represents an example of mode of implementing a pulse width adjusting means according to the invention.

Figure 9:
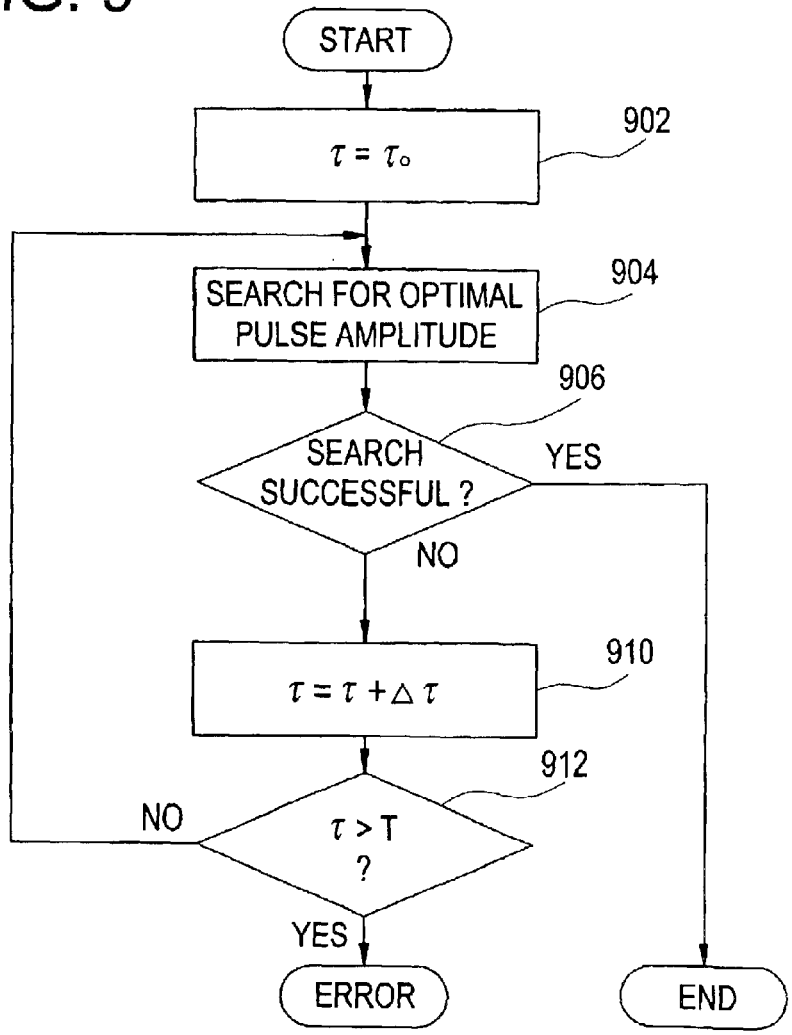
FIG. 9 is a flow chart of the operation of an apparatus, which represents an example of mode of implementing the invention.

FIG. 9 is a flow chart of the operation of this apparatus. As shown in the chart, the pulse width is set at step 902. The setting of the pulse width is accomplished by the pulse width adjusting section 712. A pulse width $\tau 0$ is thereby set.

Next at step 904, an optimal pulse amplitude search is performed. The optimal pulse amplitude search is an operation to search for the optimal level of the amplitude of the RF pulse. The optimal level of the amplitude of the RF pulse means the amplitude that can excite a spin so as to make the flip angle identical with its target value.

The flip angle is proportional to the amplitude of the RF pulse. Therefore, it can be found out whether or not the flip angle has become identical with its target value by transmitting the RF pulse while varying the amplitude of the RF pulse consecutively and checking the free induction decay (FID) that is obtained each time. As the target value of the flip angle, either 90° or 180° is selected.

Figure 10:
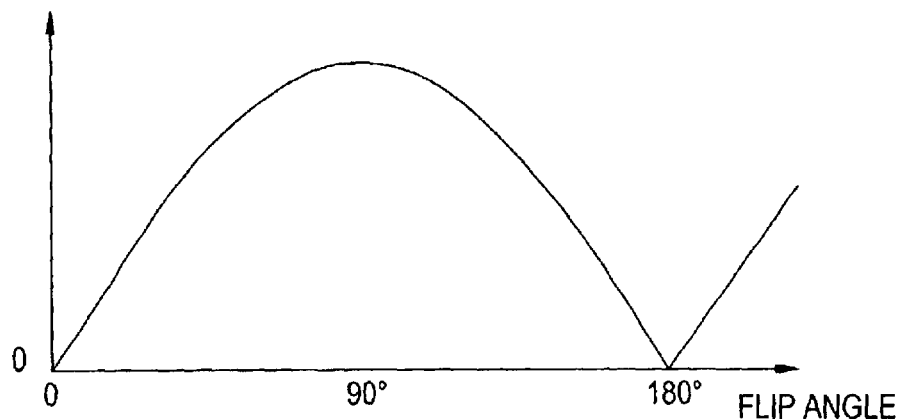
FIG. 10 is a graphic diagram illustrating the relationship between the flip angle and the FID in terms of signal intensity.

The relationship between the flip angle and the FID in terms of signal intensity is as shown in FIG. 10. Thus, the signal intensity of the FID reaches its maximum when the flip angle is 90° and its minimum when the flip angle is either 0° or 180°. The amplitude of the RF pulse to excite spins so as to make the flip angle either 90° or 180° can be figured out by utilizing this relationship.

The consecutive transmission of the RF pulse is accomplished by the operation of the pulse generating section 702 and the transmitting section 704. At each time of transmission, the gain control section 706 consecutively increases the amplitude of the RF pulse. The determination of whether or not the flip angle has reached its target value based on the FID is accomplished by the flip angle determining section 710. The determination is based on the relationship between the flip angle and the FID shown in FIG. 10.

Achievement of a pulse amplitude that makes the flip angle identical with its target value means a successful search. In that case, the RF pulse tuning is completed in accordance with the determination at step 906.

Failure to reach the target even though the amplitude of the RF pulse is brought to its maximum means an unsuccessful search. In that case, the pulse width is made $\tau+\Delta\tau$ at step 910 in accordance with the determination at step 906. In other words, the pulse width is increased by $\Delta\tau$. The pulse width is increased by the pulse width adjusting section 712. The pulse width of the RF pulse generated by the pulse generating section 702 is thereby updated.

Next, it is determined at step 912 whether or not $\tau>T$ holds true. T is the upper limit of the normal width of the RF pulse. The upper limit T is determined appropriately, with the performance of the transmitting section 704 and other factors taken into account. If it is found that $\tau>T$ holds true, it will be treated as an error, but otherwise the processing returns to step 904. And at a new pulse width, the optimal pulse amplitude is searched for in a similar manner to what was described above.

Since the flip angle is also proportional to the width of the RF pulse, the flip angle is increased by expanding the pulse width even though the pulse amplitude remains the same. Therefore, even if the optimal pulse amplitude was not obtained by the previous search, it may be obtained this time. Hereinafter in this manner, if the optimal pulse amplitude search proves unsuccessful, the search is repeated with the pulse width being expanded at step 910 by $\Delta\tau$ at a time.

By keeping the initial value $\tau 0$ and the increment $\Delta\tau$ of the pulse width at relatively small values, the amplitude of the RF pulse to make the flip angle identical with its target value can be made identical with or close to the maximum value the transmitting section 704 can output. Such a pulse amplitude is outputted by using either exactly or substantially 100% of the capacity of the transmitting section 704. Therefore, it is made possible to obtain a pulse amplitude that enables the capacity of the transmitting section 704 to be effectively utilized.

Further, such a value of the pulse amplitude reduces the pulse width to its necessary minimum. The small pulse width makes it possible to the time length of the pulse sequence, thereby to reduce the length of time required for imaging or to improve the image quality.

Figure 11:
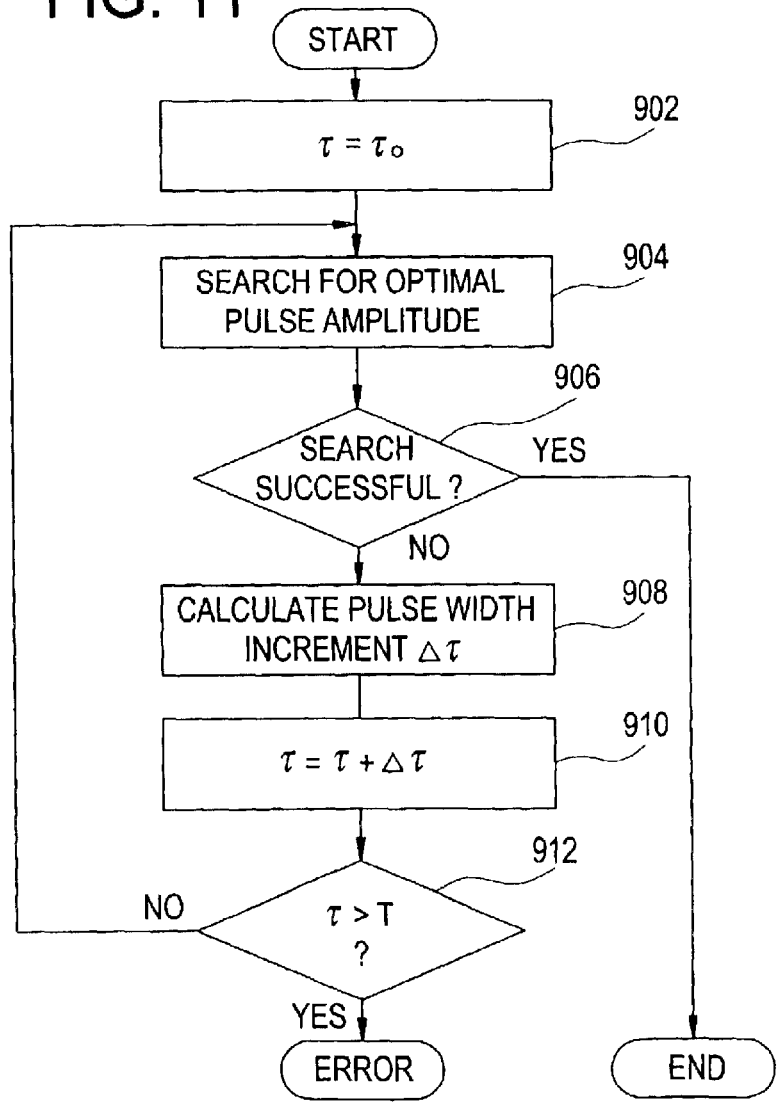
FIG. 11 is a flow chart of the operation of an apparatus, which represents an example of mode of implementing the invention.

The increment $\Delta\tau$ of the pulse width may as well be dynamically varied by calculation instead of fixing it as described above. In that case, as shown in FIG. 11, the pulse width increment $\Delta\tau$ is calculated at step 908. The calculation of $\Delta\tau$ is accomplished by the pulse width adjusting section 712. The calculation of $\Delta\tau$ is carried out in the following manner.

An unsuccessful optimal pulse amplitude search means that the flip angle does not reach its target even if the pulse amplitude is increased to the maximum that the transmitting section 704 can output. The extent of the failure to achieve the target in this case indicates to what extent the excitation is insufficient. Therefore, if the pulse width is increased to compensate for this insufficiency of excitation, the flip angle can be made identical with its target value.

Supposing, for instance, that the flip angle of the spin excited with the maximum output of the transmitting section 704 is 170° against a target value of 180°, the target can be attained by multiplying the quantity of excitation by the RF pulse by 180°/170°. To achieve this, the pulse width $\tau$ can be multiplied by 180°/170°. Therefore, the increment $\Delta\tau$ of the pulse width can be calculated by the following equation.

$$\Delta\tau = \left[\frac{180°}{170°} - 1\right]\tau \quad (1)$$

To generalize this, the calculating formula for $\Delta\tau$ is given by the following equation. The use of such $\Delta\tau$ would make it possible to reduce the length of tuning time.

$$\Delta\tau = \left[\frac{\theta_T}{\theta_{\max}} - 1\right]\tau \quad (2)$$

Here,
θT is the target flip angle, and
θmax is the attained flip angle.

If the target value of the flip angle is smaller than 90°, such as 20° for instance, the final optimal pulse amplitude and pulse width fitting the target value are calculated on the basis of the optimal pulse amplitude and pulse width figured out as described below.

Figure 12:
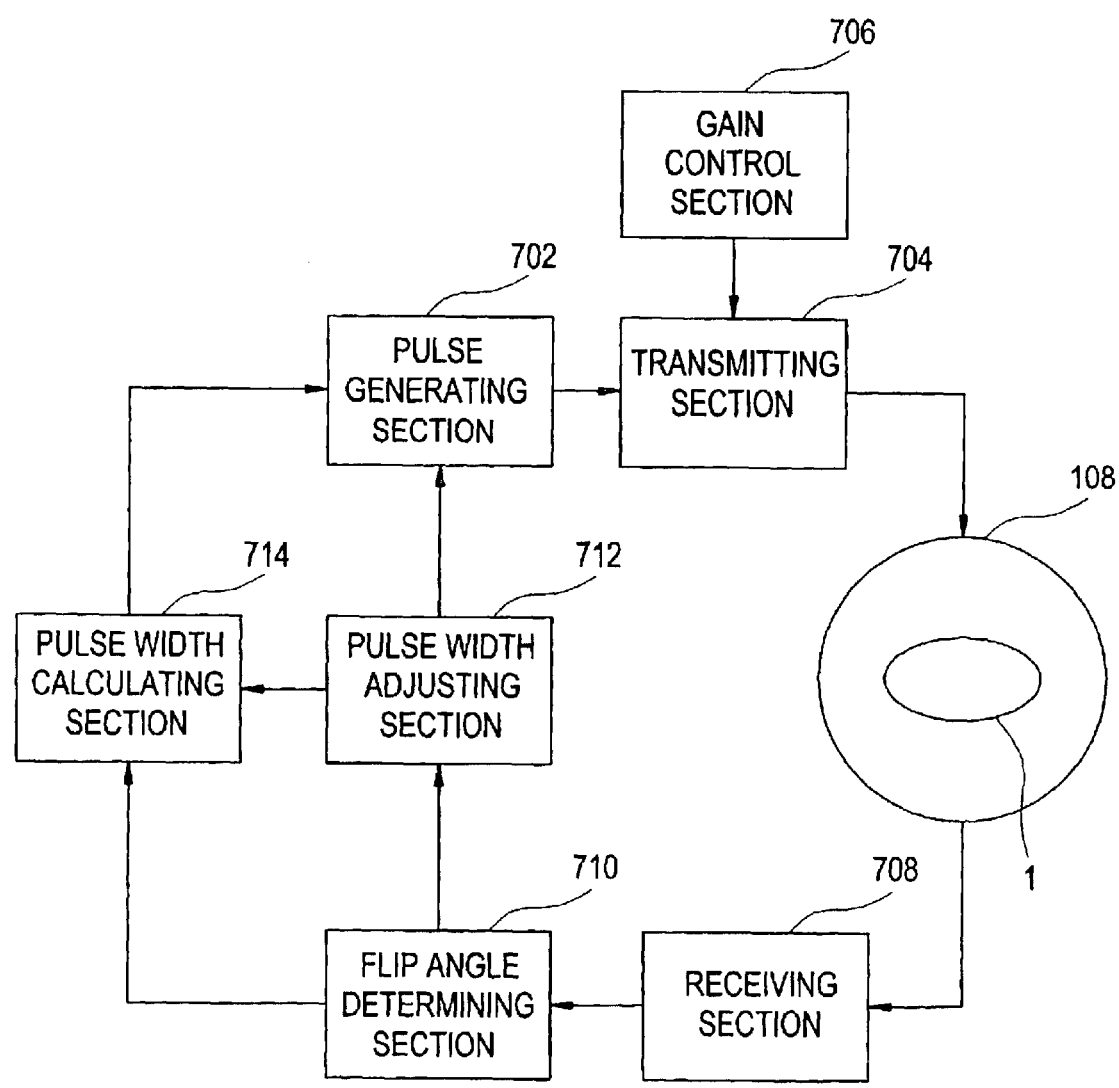
FIG. 12 is a functional block diagram of an apparatus, which represents an example of mode of implementing the invention.

FIG. 12 is a functional block diagram of this apparatus when performing RF pulse tuning in such a manner. In this diagram, the same reference signs will be assigned to respectively the same constituent parts as those shown in FIG. 7, with their description being dispensed with.

As shown in the diagram, this apparatus has a pulse width calculating section 714. The function of the pulse width calculating section 714 corresponds to that of the data processing section 170. The pulse width calculating section 714 performs calculation by using input signals from the flip angle determining section 710 and the pulse width adjusting section 712. The input signal from the flip angle determining section 710 is the optimal pulse amplitude. The input signal from the pulse width adjusting section 712 is the pulse width setpoint. The pulse width calculating section 714 represents an example of mode of implementing a calculating means according to the invention.

Figure 13:
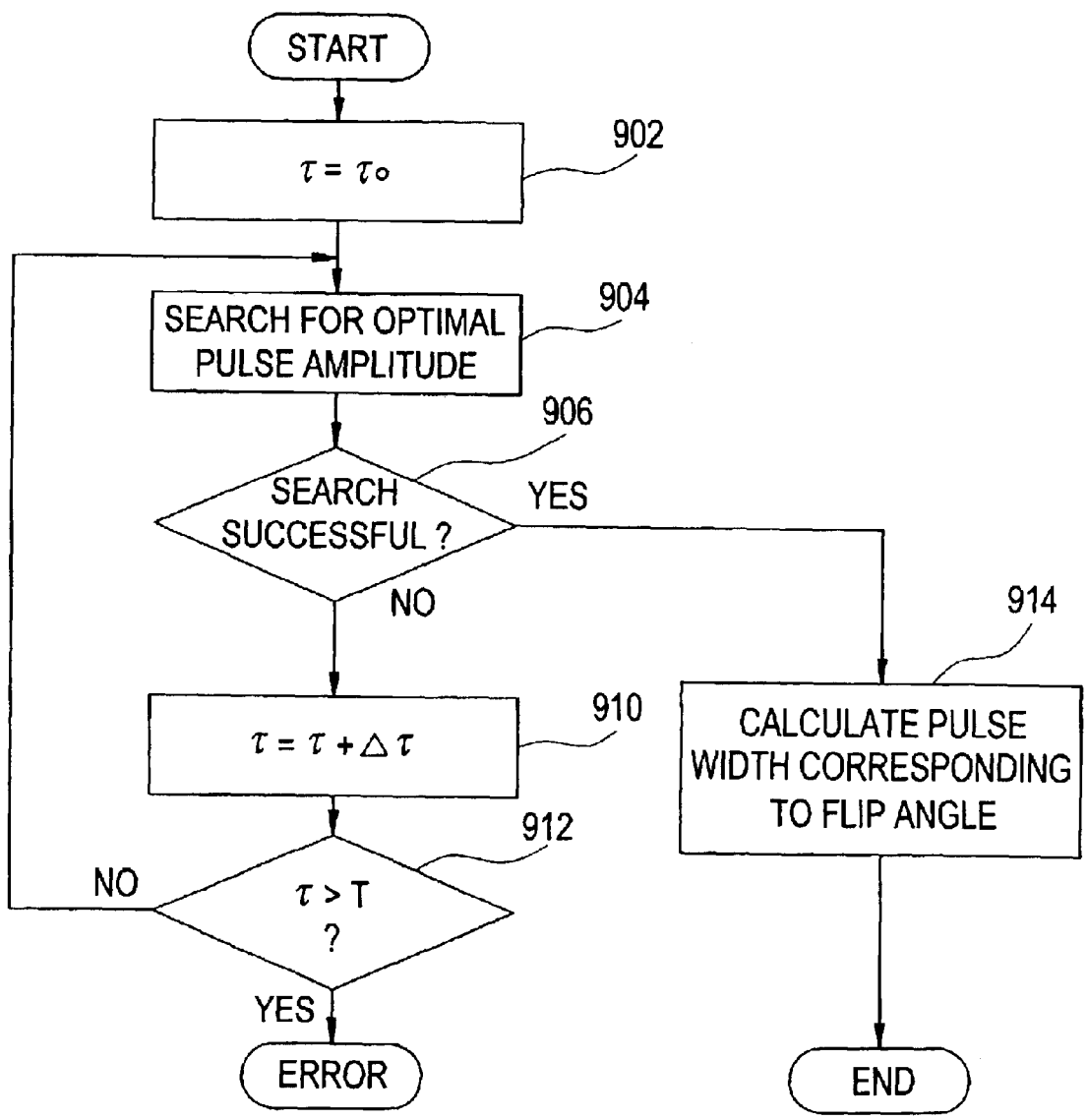
FIG. 13 is a flow chart of the operation of an apparatus, which represents an example of mode, of implementing the invention.
Figure 14:
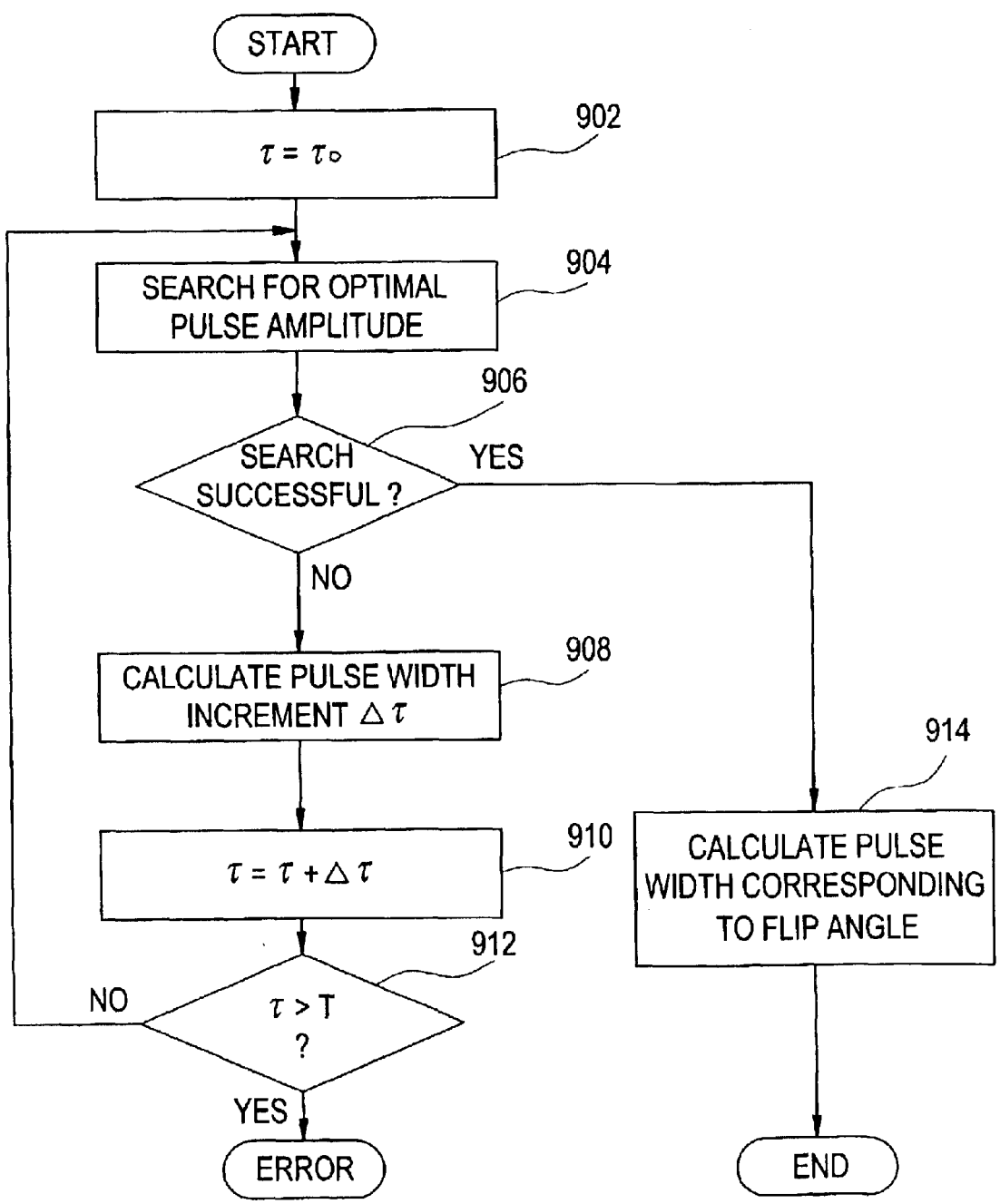
FIG. 14 is a flow chart of the operation of an apparatus, which represents an example of mode of implementing the invention.

FIG. 13 and FIG. 14 are flow charts of the operation of this apparatus. These flow charts are respectively versions of the flow charts shown as FIG. 9 and FIG. 11 supplemented with step 914. At step 914, pulse width calculation is performed according to the flip angle. This calculation is accomplished by the pulse width calculating section 714. The pulse width calculating section 714 calculates the pulse width τ by the following equation.

$$\tau = \frac{\theta_{T2}}{\theta_{T1}} \cdot \frac{a_{T1}}{a_{max}} \cdot \tau_{T1} \quad (3)$$

Here,
θT1 is an intermediate target flip angle;
θT2, the final target flip angle;
aT1, the optimal pulse amplitude;
amax, the maximum amplitude of the RF pulse that the transmitting section 704 can output, and
τT1, the pulse width setpoint.

The intermediate target flip angle θT1 is, for instance, 90° or 180°. The final target flip angle θT2 is, for instance, 30°. The optimal pulse amplitude aT1 is an input signal from the flip angle determining section 710. This is the optimal pulse amplitude that makes the flip angle identical with the intermediate target value. The pulse width setpoint τT1 is an input signal from the pulse width adjusting section 712. This is the pulse width setpoint that makes the flip angle identical with the intermediate target value.

Equation (3) is an equation to figure out the pulse width that makes the flip angle identical with the final target value θT2 when the pulse amplitude is made the maximum amplitude amax of the RF pulse that the transmitting section 704 is able to output. As the pulse amplitude is made the maximum amplitude amax, the pulse width takes on an even smaller value than when the angle is 90° or 180°. This makes it possible to, reduce even further the length of time required for imaging.

While the present invention has been described so far with reference to examples of preferable modes of implementing it, persons having usual knowledge in the technical field to which the invention belongs can modify or replace the above-described modes of implementation without deviating from the technical scope of the invention. Therefore, the technical scope of the invention covers not only the above-described examples of modes of implementation but all the modes of implementation belonging to the scope of claims.

Many widely different embodiments of the invention may be configured without departing from the spirit and the scope of the present invention. It should be understood that the present invention is not limited to the specific embodiments described in the specification, except as defined in the appended claims.

What is claimed is:

1. An RF pulse tuning method for timing an RF pulse for excitation use so as to make a flip angle of spins identical with a target value, said method comprising:

determining if the flip angle fails to reach the target value when an amplitude of the RF pulse is increased to a maximum of a plurality of values; and consecutively increasing a pulse width of the RF pulse from a predetermined initial value until the flip angle of spins becomes identical with the target value, wherein said consecutively increasing includes increasing the pulse width if the flip angle fails to reach the target value when the amplitude is increased.

2. The RF pulse tuning method of claim 1, further comprising determining an increment of the pulse width based on an extent of failure of the flip angle to attain the target value.

3. The RF pulse tuning method of claim 1, wherein said target value is 90°.

4. The RF pulse tuning method of claim 1, wherein said target value is 180°.

5. An apparatus for tuning an RF pulse for excitation use so as to make a flip angle of spins identical with a target value, said apparatus comprising:

a flip angle determining section configured to determine if the flip angle fails to reach the target value when an amplitude of the RF pulse is increased to a maximum of a plurality of values; and a pulse width adjusting device for consecutively increasing a pulse width of the RF pulse from a predetermined initial value until the flip angle of spins becomes identical with the target value, wherein said pulse width adjusting device consecutively increases the pulse width if the flip angle fails to reach the target value when the amplitude is increased.

6. The RF pulse tuning apparatus of claim 5, wherein said pulse width adjusting device determines an increment of the pulse width based on an extent of failure of the flip angle to attain the target value.

7. The RF pulse tuning apparatus of claim 5, wherein said target value is 90°.

8. The RF pulse tuning apparatus of claim 5, wherein said target value is 180°.

9. An apparatus for tuning an RF pulse for excitation use so as to make a flip angle of spins identical with a target value, said apparatus comprising:

a pulse width adjusting device for consecutively increasing a pulse width of the RF pulse from a predetermined initial value until the flip angle of spins becomes identical with an intermediate target value; and a calculating device for calculating a first set of conditions of the RF pulse for making the flip angle of spins identical with a final target value which is smaller than said intermediate target value, wherein said calculating device calculates the first set of conditions from a second set of conditions of the RF pulse, the second set of conditions makes the flip angle of spins identical with said intermediate target value, and the second set of conditions includes a maximum of a plurality of amplitudes of the RF pulse.

10. The RF pulse tuning apparatus of claim 9, wherein said calculating device figures out the pulse width at the maximum of the plurality of values of amplitudes of the RF pulse.

11. The RF pulse tuning apparatus of claim 9, further comprising:

a flip angle determining section configured to determine if the flip angle fails to reach said target value when one of the amplitudes of the RF pulse is raised to the maximum of the plurality of values, said pulse width adjusting device determines an increment of the pulse width based on an extent of failure of the flip angle to attain the target value.

12. The RF pulse tuning apparatus of claim 9, wherein said intermediate target value is 90°.

13. The RF pulse tuning apparatus of claim 9, wherein said intermediate target value is 180°.

* * * * *

UNITED STATES PATENT AND TRADEMARK OFFICE
CERTIFICATE OF CORRECTION

PATENT NO. : 6,812,699 B2 Page 1 of 1
DATED : November 2, 2004
INVENTOR(S) : Kazuya Hoshino It is certified that error appears in the above-identified patent and that said Letters Patent is hereby corrected as shown below:

Column 12,
Line 13, after "for" delete "timing" and insert -- tuning --.

Signed and Sealed this

Thirtieth Day of May, 2006

JON W. DUDAS
*Director of the United States Patent and Trademark Office*